United States Patent
Li et al.

(10) Patent No.: US 7,515,282 B2
(45) Date of Patent: Apr. 7, 2009

(54) MODELING AND MEASURING STRUCTURES WITH SPATIALLY VARYING PROPERTIES IN OPTICAL METROLOGY

(75) Inventors: Shifang Li, Pleasanton, CA (US); Vi Vuong, Fremont, CA (US); Alan Nolet, San Jose, CA (US); Junwei Bao, Fremont, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 335 days.

(21) Appl. No.: 11/173,198

(22) Filed: Jul. 1, 2005

(65) Prior Publication Data

US 2007/0002337 A1    Jan. 4, 2007

(51) Int. Cl.
*G01B 11/14* (2006.01)
(52) U.S. Cl. ..................................... 356/625
(58) Field of Classification Search .................. 356/625
See application file for complete search history.

(56) References Cited

U.S. PATENT DOCUMENTS

| | | | |
|---|---|---|---|
| 6,608,690 B2 * | 8/2003 | Niu et al. ................. | 356/635 |
| 6,785,638 B2 | 8/2004 | Niu et al. | |
| 6,891,626 B2 | 5/2005 | Niu et al. | |
| 6,943,900 B2 | 9/2005 | Niu et al. | |
| 2002/0033954 A1 * | 3/2002 | Niu et al. ................. | 356/601 |
| 2004/0017575 A1 * | 1/2004 | Balasubramanian et al. | 356/625 |
| 2004/0267397 A1 | 12/2004 | Doddi et al. | |
| 2005/0192914 A1 * | 9/2005 | Drege et al. .............. | 706/12 |

OTHER PUBLICATIONS

Haykin, S., (1999) *Neural Networks*, Prentice Hall.
Li, L., (1996) "Formulation and comparison of two recursive matrix algorithms for modeling layered diffraction gratings," *J. Opt. Soc. Am.*, A13: pp. 1024-1035.

* cited by examiner

*Primary Examiner*—Hwa (Andrew) S Lee
*Assistant Examiner*—Jonathan M Hansen
(74) *Attorney, Agent, or Firm*—Morrison & Foerster LLP

(57) ABSTRACT

The profile of a structure having a region with a spatially varying property is modeled using an optical metrology model. A set of profile parameters is defined for the optical metrology model to characterize the profile of the structure. A set of layers is defined for a portion the optical metrology model that corresponds to the region of the structure with the spatially varying property, each layer having a defined height and width. For each layer, a mathematic function that varies across at least a portion of the width of the layer is defined to characterize the spatially varying property within a corresponding layer in the region of the structure.

19 Claims, 4 Drawing Sheets

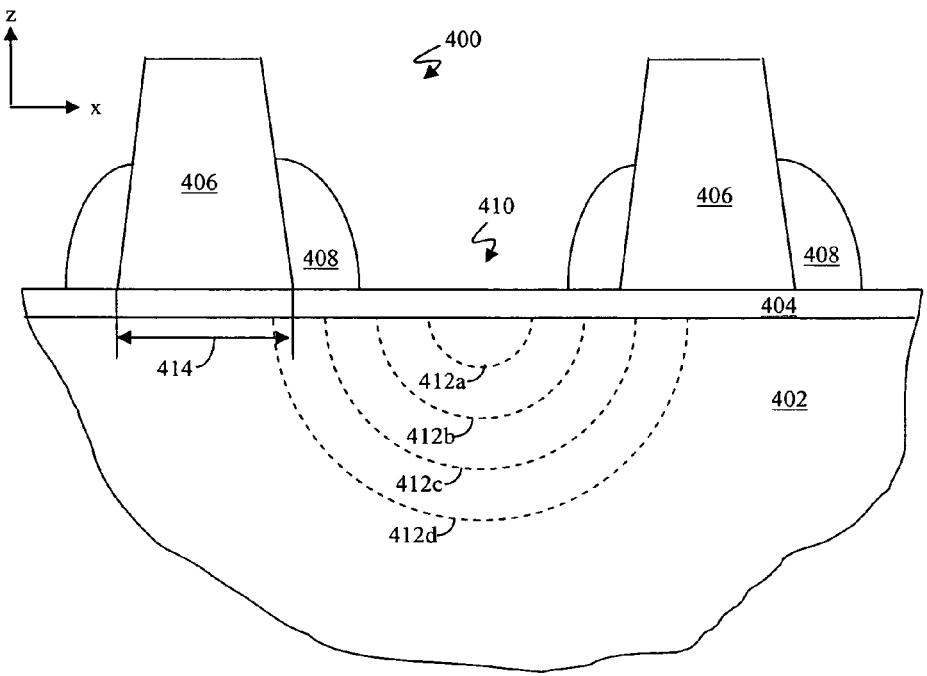
FIG. 4
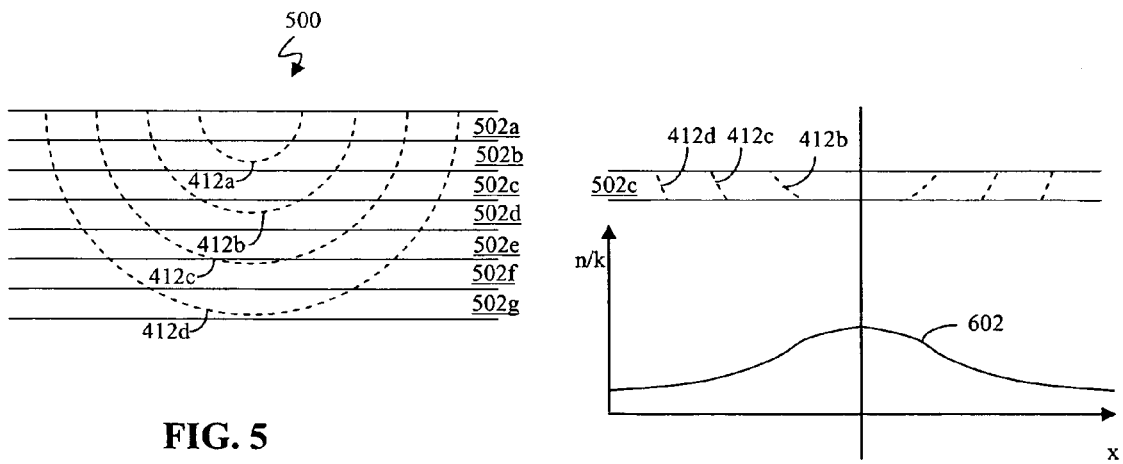
FIG. 5
FIG. 6

MODELING AND MEASURING STRUCTURES WITH SPATIALLY VARYING PROPERTIES IN OPTICAL METROLOGY

BACKGROUND

1. Field of the Invention

The present application relates to optical metrology, and, more particularly, to modeling and measuring structures with spatially varying properties in optical metrology.

2. Related Art

Optical metrology involves directing an incident beam at a structure, measuring the resulting diffracted beam, and analyzing the diffracted beam to determine various characteristics, such as the profile of the structure. In semiconductor manufacturing, optical metrology is typically used for quality assurance. For example, after fabricating a periodic grating in proximity to a semiconductor chip on a semiconductor wafer, an optical metrology system is used to determine the profile of the periodic grating. By determining the profile of the periodic grating, the quality of the fabrication process utilized to form the periodic grating, and by extension the semiconductor chip proximate the periodic grating, can be evaluated.

Conventional optical metrology is used to determine the deterministic profile of a structure formed on a semiconductor wafer. For example, conventional optical metrology is used to determine the critical dimension of a structure. However, the structure may be formed with a region with a spatially varying property, such as material refractive indices (n and k values), thickness, roughness, and the like. The spatially varying property of the structure is not accounted for in conventional optical metrology, which can produce inaccurate or erroneous results.

SUMMARY

In one exemplary embodiment, the profile of a structure having a region with a spatially varying property is modeled using an optical metrology model. A set of profile parameters is defined for the optical metrology model to characterize the profile of the structure. A set of layers is defined for a portion the optical metrology model that corresponds to the region of the structure with the spatially varying property, each layer having a defined height and width. For each layer, a mathematic function that varies across at least a portion of the width of the layer is defined to characterize the spatially varying property within a corresponding layer in the region of the structure.

DESCRIPTION OF DRAWING FIGURES

The present application can be best understood by reference to the following description taken in conjunction with the accompanying drawing figures, in which like parts may be referred to by like numerals:

FIG. 4 depicts an structure having a region with a spatially varying property;

FIG. 5 depicts a portion of an optical metrology model that characterizes the region with a spatially varying property of the structure depicted in FIG. 4; and FIG. 6 depicts a mathematic function defined for a layer of the portion of the optical metrology model depicted in FIG. 5.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology

Figure 1:
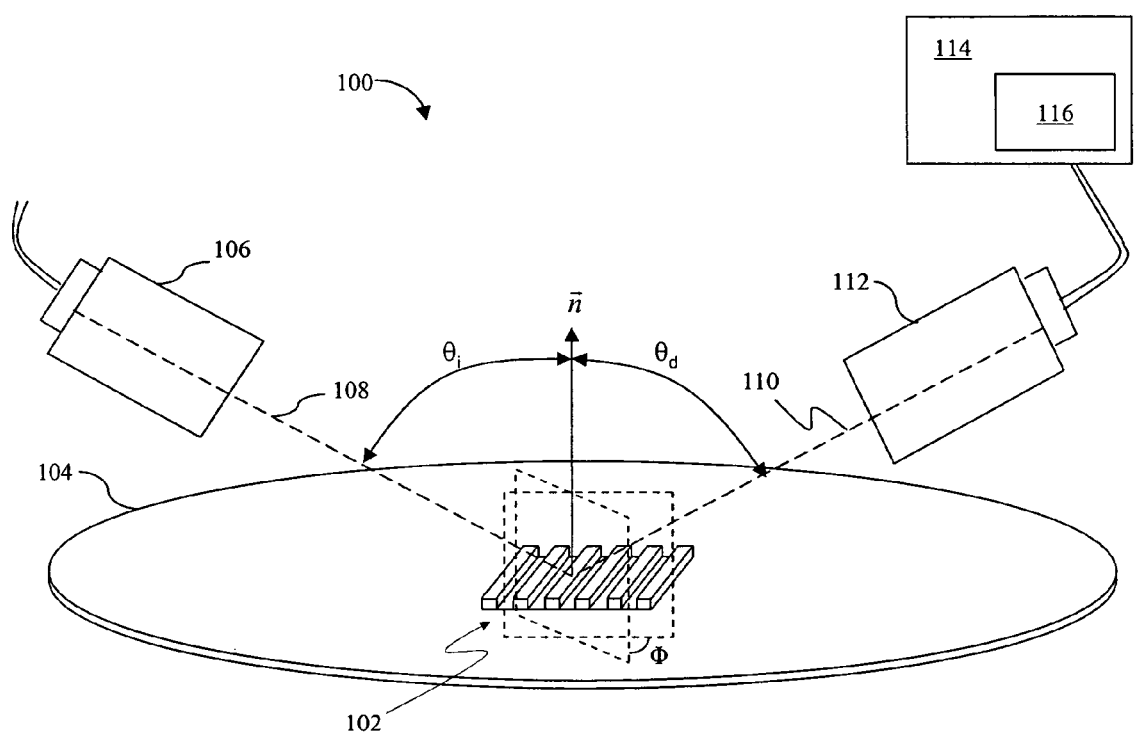
FIG. 1 depicts an exemplary optical metrology system.

With reference to FIG. 1, an optical metrology system 100 can be used to examine and analyze a structure. For example, optical metrology system 100 can be used to determine the profile of a periodic grating 102 formed on wafer 104. As described earlier, periodic grating 102 can be formed in test areas on wafer 104, such as adjacent to a device formed on wafer 104. Alternatively, periodic grating 102 can be formed in an area of the device that does not interfere with the operation of the device or along scribe lines on wafer 104.

As depicted in FIG. 1, optical metrology system 100 can include a photometric device with a source 106 and a detector 112. Periodic grating 102 is illuminated by an incident beam 108 from source 106. In the present exemplary embodiment, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. Detector 112 converts the diffracted beam 110 into a measured diffraction signal.

To determine the profile of periodic grating 102, optical metrology system 100 includes a processing module 114 configured to receive the measured diffraction signal and analyze the measured diffraction signal. As described below, the profile of periodic grating 102 can then be determined using a library-based process or a regression-based process. Additionally, other linear or non-linear profile extraction techniques are contemplated.

2. Library-based Process of Determining Profile of Structure

In a library-based process of determining the profile of a structure, the measured diffraction signal is compared to a library of simulated diffraction signals. More specifically, each simulated diffraction signal in the library is associated with an optical metrology model of the structure. When a match is made between the measured diffraction signal and one of the simulated diffraction signals in the library or when the difference of the measured diffraction signal and one of the simulated diffraction signals is within a preset or matching criterion, the optical metrology model associated with the matching simulated diffraction signal is presumed to represent the actual profile of the structure. The matching simulated diffraction signal and/or optical metrology model can then be utilized to determine whether the structure has been fabricated according to specifications.

Thus, with reference again to FIG. 1, in one exemplary embodiment, after obtaining a measured diffraction signal, processing module 114 then compares the measured diffraction signal to simulated diffraction signals stored in a library 116. Each simulated diffraction signal in library 116 can be associated with an optical metrology model. Thus, when a match is made between the measured diffraction signal and one of the simulated diffraction signals in library 116, the optical metrology model associated with the matching simulated diffraction signal can be presumed to represent the actual profile of periodic grating 102.

The set of optical metrology models stored in library 116 can be generated by characterizing the profile of a structure using a set of profile parameters, then varying the set of profile parameters to generate optical metrology models of varying shapes and dimensions. The process of characterizing a profile using a set of profile parameters can be referred to as parameterizing.

Figure 2A:
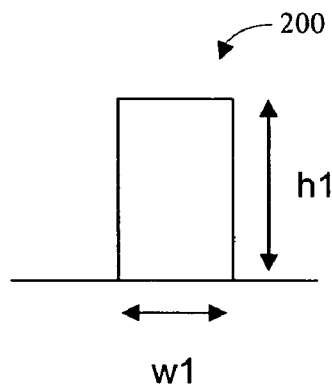
FIGS. 2A-2E depict various optical metrology models of a structure.
Figure 2C:
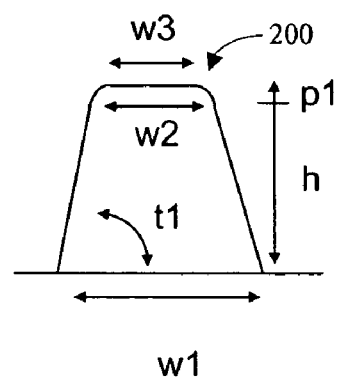
Figure 2B:
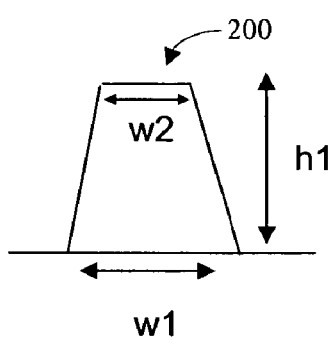
Figure 2D:
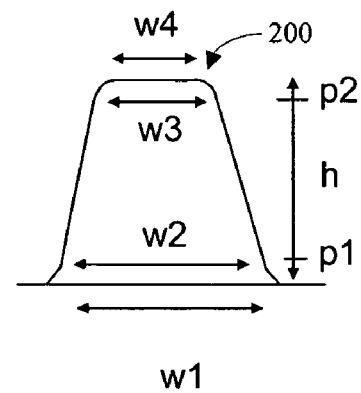
Figure 2E:
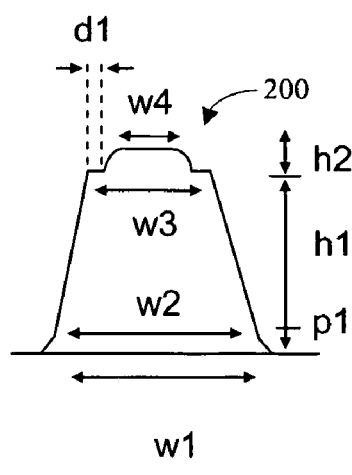

For example, as depicted in FIG. 2A, assume that the profile of a structure is characterized using optical metrology model 200 with profile parameters h1 and w1 that define its height and width, respectively. As depicted in FIGS. 2B to 2E, additional shapes and features of the profile can be characterized by increasing the number of profile parameters used in optical metrology model 200. For example, as depicted in FIG. 2B, optical metrology model 200 can include profile parameters h1, w1, and w2 that define its height, bottom width, and top width, respectively. Note that the width of optical metrology model 200 can be referred to as the critical dimension (CD). For example, in FIG. 2B, profile parameter w1 and w2 can be described as defining the bottom CD and top CD, respectively, of optical metrology model 200.

As described above, the set of optical metrology models stored in library 116 (FIG. 1) can be generated by varying the profile parameters used in the optical metrology model. For example, with reference to FIG. 2B, by varying profile parameters h1, w1, and w2, optical metrology models of varying shapes and dimensions can be generated. Note that one, two, or all three profile parameters can be varied relative to one another.

With reference again to FIG. 1, the number of optical metrology models and corresponding simulated diffraction signals in the set of optical metrology models and simulated diffraction signals stored in library 116 (i.e., the resolution and/or range of library 116) depends, in part, on the range over which the set of profile parameters and the increment at which the set of profile parameters are varied. In one exemplary embodiment, the optical metrology models and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using AFM, X-SEM, and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-based Process of Determining Profile of Structure

In a regression-based process of determining the profile of a structure, the measured diffraction signal is compared to a simulated diffraction signal (i.e., a trial diffraction signal). The simulated diffraction signal is generated prior to the comparison using a set of profile parameters (i.e., trial profile parameters) for an optical metrology model. If the measured diffraction signal and the simulated diffraction signal do not match or when the difference of the measured diffraction signal and one of the simulated diffraction signals is not within a preset or matching criterion, another simulated diffraction signal is generated using another set of profile parameters for another optical metrology model, then the measured diffraction signal and the newly generated simulated diffraction signal are compared. When the measured diffraction signal and the simulated diffraction signal match or when the difference of the measured diffraction signal and one of the simulated diffraction signals is within a preset or matching criterion, the optical metrology model associated with the matching simulated diffraction signal is presumed to represent the actual profile of the structure. The matching simulated diffraction signal and/or optical metrology model can then be utilized to determine whether the structure has been fabricated according to specifications.

Thus, with reference again to FIG. 1, in one exemplary embodiment, processing module 114 can generate a simulated diffraction signal for an optical metrology model, and then compare the measured diffraction signal to the simulated diffraction signal. As described above, if the measured diffraction signal and the simulated diffraction signal do not match or when the difference of the measured diffraction signal and one of the simulated diffraction signals is not within a preset or matching criterion, then processing module 114 can iteratively generate another simulated diffraction signal for another optical metrology model. In one exemplary embodiment, the subsequently generated simulated diffraction signal can be generated using an optimization algorithm, such as global optimization techniques, which includes simulated annealing, and local optimization techniques, which includes steepest descent algorithm.

In one exemplary embodiment, the simulated diffraction signals and optical metrology models can be stored in a library 116 (i.e., a dynamic library). The simulated diffraction signals and optical metrology models stored in library 116 can then be subsequently used in matching the measured diffraction signal.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, now U.S. Pat. No. 6,785,638, issued Aug. 31, 2004, which is incorporated herein by reference in its entirety.

4. Rigorous Coupled Wave Analysis

As described above, simulated diffraction signals are generated to be compared to measured diffraction signals. As will be described below, in one exemplary embodiment, simulated diffraction signals can be generated by applying Maxwell's equations and using a numerical analysis technique to solve Maxwell's equations. More particularly, in the exemplary embodiment described below, rigorous coupled-wave analysis (RCWA) is used. It should be noted, however, that various numerical analysis techniques, including variations of RCWA, can be used.

In general, RCWA involves dividing an optical metrology model into a number of layers, sections, slices, or slabs (hereafter simply referred to as layers). For each layer of the optical metrology model, a system of coupled differential equations generated using a Fourier expansion of Maxwell's equations (i.e., the components of the electromagnetic field and permittivity ($\epsilon$)). The system of differential equations is then solved using a diagonalization procedure that involves eigenvalue and eigenvector decomposition (i.e., Eigen-decomposition) of the characteristic matrix of the related differential equation system. Finally, the solutions for each layer of the optical metrology model are coupled using a recurrent-coupling schema, such as a scattering matrix approach. For a description of a scattering matrix approach, see Lifeng Li, "Formulation and comparison of two recursive matrix algorithms for modeling layered diffraction gratings," J. Opt. Soc. Am. A13, pp 1024-1035 (1996), which is incorporated herein by reference in its entirety. For a more detailed description of RCWA, see U.S. patent application Ser. No. 09/770,997, titled CACHING OF INTRA-LAYER CALCULATIONS FOR RAPID RIGOROUS COUPLED-WAVE ANALYSES, filed on Jan. 25, 2001, now U.S. Pat. No. 6,891,626, issued May 10, 2005, which is incorporated herein by reference in its entirety.

5. Machine Learning Systems

In one exemplary embodiment, simulated diffraction signals can be generated using a machine learning system employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

6. Structures with Spatially Varying Properties

As described above, optical metrology can be used to determine the profile of a structure formed on a semiconductor wafer. More particularly, various deterministic characteristics of the structure (e.g., height, width, critical dimension, line width, and the like) can be determined using optical metrology. Thus the profile of the structure obtained using optical metrology is the deterministic profile of the structure.

However, as also described above, the structure may be formed with a region with spatially varying property, such as material index of refraction and coefficient of extinction (n and k values), thickness, roughness, and the like. Thus, in one exemplary embodiment, spatially varying properties are accounted for in the optical metrology model to more accurately determine the profile of the structure.

Figure 3:
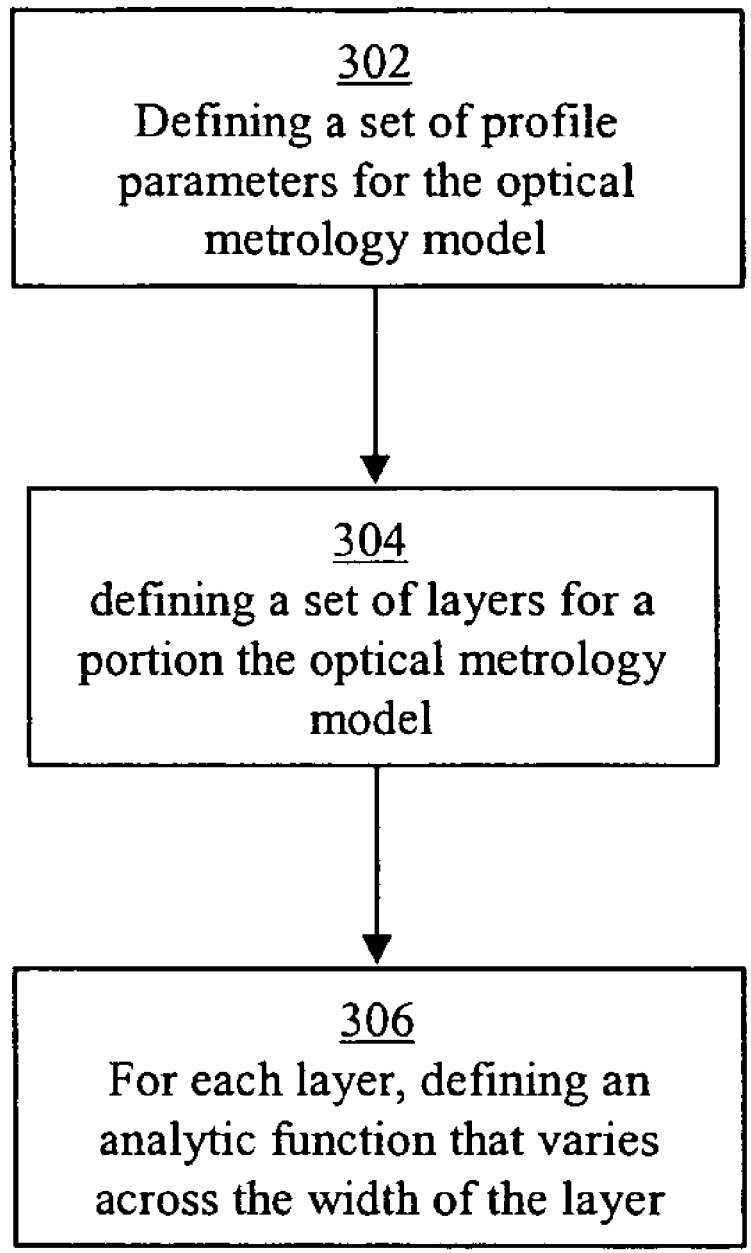
FIG. 3 depicts an exemplary process to model the profile of a structure having a region with a spatially varying property.

With reference to FIG. 3, an exemplary process 300 is depicted of modeling the profile of a structure having a region with a spatially varying property using an optical metrology model. As described above, the optical metrology model developed using process 300 can be used to determine the profile of the structure using optical metrology when the structure is actually formed on a wafer.

In step 302, a set of profile parameters for the optical metrology model is defined to characterize the profile of the structure. As depicted in FIGS. 2B to 2E and described above, any number of profile parameters can be used to characterize various aspects of the profile of the structure.

In step 304, a set of layers is defined for a portion of the optical metrology model that corresponds to the region of the structure with the spatially varying property. Each layer defined in the set of layers has a defined height and width. As described above, a structure may be formed with various spatially varying properties, such as material index of refraction and coefficient of extinction (n and k values), thickness, roughness, and the like.

For example, with reference to FIG. 4, assume that the structure formed on the wafer is a transistor 400. In the present example, transistor 400 is formed on a portion of a substrate 402 with an oxide layer 404. A poly line 406 is formed on oxide layer 404, and functions as the gate for transistor 400. Spacers 408 are formed adjacent to poly line 406. A region 410 of substrate 402 is doped with a dopant, typically using an ion implantation process, to form an active region (i.e., the source or drain) of transistor 400.

As depicted in FIG. 4, in the present example, the spatially varying property of transistor 400 is the spatial variation in the material index of refraction and coefficient of extinction (n and k values) resulting from the ion implantation process in region 410. As is well known, ion implantation processes typically alter the n and k values of substrate 402. In particular, as depicted in FIG. 4 by contour lines 412a, 412b, 412c, and 412d, the n and k values tend to decrease from the point at which the ion implantation process is performed. Thus, the n and k value associated with contour line 412a is greater than the n and k value associated with contour line 412b. Similarly, the n and k value associated with contour line 412b is greater than the n and k value associated with contour line 412c. It should be recognized that the variation in the n and k value throughout region 410 can be continuous or discrete. The spatial variation can also occur in any direction or combination of directions, and can be continuous in one or more directions and discrete in one or more directions.

If spatial variation is not taken into account during the spectrum simulation and profile extraction process, then the spatial variation in the n and k value of region 410 can reduce the accuracy of an optical metrology process used to examine transistor 400. For example, assume optical metrology is used to determine critical dimension 414 (i.e., the bottom width) of poly line 406. If the refractive index of bulk silicon material is used for the entire substrate 402 during simulation, the spatial variation in the n and k value of region 410 can produce measurements of critical dimension 414 that are either inaccurate or erroneous.

Thus, in the present example, in accordance with step 304 (FIG. 3), a set of layers for a portion 500 of the optical metrology model that corresponds to region 410 (FIG. 4) is defined. In particular, with reference to FIG. 5, portion 500 is depicted as being divided into a set of seven layers (i.e., layers 502a-502g). In the present exemplary embodiment, each of the layers have the same thickness (i.e., height). Additionally, the thickness of the layers can be determined based on an approximation of the variation of the property, which in this example is the variation in the n and k values, in the direction in which portion 500 is sliced, which in this example is along the z direction. It should be recognized, however, that portion 500 can be divided into any number of layers having various thicknesses.

With reference again to FIG. 3, after defining a set of layers for the portion of the optical metrology model that corresponds to the region of the structure with the spatially varying property, in step 306, for each layer, a mathematic function is defined. The defined mathematic function varies across at least a portion of the width of the layer to characterize the spatially varying property within a corresponding layer in the region of the structure. It should be recognized that the mathematic function can be various types of functions, such as straight line, polynomial, cubic, spline, a derivative of basic functions, and the like.

For example, with reference to FIG. 6, returning to the example of transistor 400 (FIG. 4), for each of the layer, such as layer 502c, a mathematic function 602 is defined. As depicted in FIG. 6, mathematic function 602 varies across at least a portion of the width of layer 502c, depicted as the x direction in FIG. 6, to characterize the variation in the n and k values within layer 402c, which is exemplified by contour lines 412b, 412c, and 412d. As noted above, various types of mathematic functions can be used to characterize the spatially varying property. For example, various mathematic functions have been used to model the variation in the n and k values resulting from an ion implantation process.

In one exemplary embodiment, after an optical metrology model has been defined, a simulated diffraction signal is generated based on the defined optical metrology model. As described above, the simulated diffraction signal can be generated utilizing a numerical analysis technique, such as RCWA, or a machine learning system.

As described above, the generated diffraction signal can be used to determine the profile of a structure to be examined. For example, in a library based system, a plurality of optical metrology model, including the parameters used in the mathematic functions to characterize the spatially varying property, and corresponding simulated diffraction signal pairs are generated. In particular, one or more of the profile parameters of the optical metrology model and the parameters used in the mathematic functions to characterize the spatially varying property are varied to generate a set of optical metrology models. A set of corresponding simulated diffraction signals are generated for the set of optical metrology model. The plurality of optical metrology model and corresponding simulated diffraction signal pairs are stored in a library. A diffraction signal is measured from directing an incident beam at a structure to be examined (a measured diffraction signal). The measured diffraction signal is compared to one or more simulated diffraction signals stored in the library to determine the shape of the structure being examined.

In one exemplary embodiment, in generating the library, the parameters of the mathematic functions are varied based on the location of the wafer where the structure with the spatially varying property is located. The library is then indexed by locations on the wafer. Before a measured diffraction signal is compared to a simulated diffraction signal in the library, the location on the wafer from where the measured diffraction signal was measured is obtained. The simulated diffraction signal to be compared is obtained from the portion of the library corresponding to the obtained location on the wafer.

In a regression based system, a diffraction signal is measured (a measured diffraction signal). The measured diffraction signal is compared to a simulated diffraction signal. When the measured diffraction signal and the simulated diffraction signal do not match within a preset criteria, a different simulated diffraction signal is generated. In generating the different simulated diffraction signal, one or more of the profile parameters or the parameters used in the mathematic functions to characterize the spatially varying property of the optical metrology model corresponding to the simulated diffraction signal is varied. The different simulated diffraction signal is then compared to the measured diffraction signal. This process is iterated until the measured diffraction signal and the simulated diffraction signal match within the preset criteria.

Although exemplary embodiments have been described, various modifications can be made without departing from the spirit and/or scope of the present invention. Therefore, the present invention should not be construed as being limited to the specific forms shown in the drawings and described above.

We claim:

1. A method of modeling a profile of a structure having a region with a spatially varying property using an optical metrology model, wherein the optical metrology model is to be used to determine the profile of the structure using optical metrology when the structure is formed on a wafer, the method comprising:

defining a set of profile parameters for the optical metrology model to characterize the profile of the structure;

defining a set of layers for a portion of the optical metrology model that corresponds to the substrate region of the structure with the spatially varying property, wherein the spatially varying property is a property of the substrate region, each layer having a defined height and width;

for each layer, defining a mathematic function that varies across at least a portion of the width of the layer to characterize the spatially varying property within a corresponding layer in the substrate region of the structure, wherein the mathematical function characterizes the variation of the spatially varying property in a first direction and a second direction within the corresponding layer in the substrate region of the structure, and wherein the first and second directions are perpendicular;

defining the optical metrology model using the mathematical function; and storing the optical metrology model.

2. The method of claim 1, wherein the spatially varying property varies continuously in the first and second directions, and wherein the mathematic functions of the layers are continuous functions.

3. The method of claim 1, wherein the spatially varying property is an index of refraction and coefficient of extinction.

4. The method of claim 1, wherein the structure is a transistor with a gate region and active regions, and wherein the substrate region of the structure with the spatially varying property corresponds to an active region of the transistor after the active region has been doped with a dopant.

5. The method of claim 1, wherein the spatially varying property is a thickness or roughness of the structure.

6. The method of claim 1, further comprising:

generating a simulated diffraction signal based on the optical metrology model of the structure using a numerical analysis technique.

7. The method of claim 6, wherein the numerical analysis technique is rigorous coupled-wave analysis.

8. The method of claim 6, wherein the simulated diffraction signal is generated using a machine learning system.

9. The method of claim 6, further comprising:

varying one or more profile parameters of the optical metrology signal to generate a set of simulated diffraction signals;

varying one or more parameters of the mathematic functions of the set of layers of the portion of the optical metrology model that corresponds to the substrate region of the structure with the spatially varying property;

storing the optical metrology models and simulated diffraction signals in a library;

obtaining a measured diffraction signal from a structure formed on a wafer;

comparing the measured diffraction signal to one or more of the simulated diffraction signals in the library; and when the measured diffraction signal matches a simulated diffraction signal in the library within a preset criterion, determining the profile of the structure based on the optical metrology signal corresponding to the matching simulated diffraction signal.

10. The method of claim 9, wherein the one or more parameters of the mathematic functions are varied based on the location on the wafer where the structure with the spatially varying property is located, and wherein the library is indexed by locations on the wafer.

11. The method of claim 10, further comprising:
prior to comparing the measured diffraction signal to a simulated diffraction signals in the library, obtaining the location on the wafer from where the measured diffraction signal was measured;
obtaining the simulated diffraction signal to be compared to the measured diffraction signal from a portion of the library corresponding to the obtained location on the wafer.

12. The method of claim 6, further comprising:
a) obtaining a measured diffraction signal from a structure formed on a wafer;
b) comparing the measured diffraction signal to the simulated diffraction signal;
c) when the measured diffraction signal matches the simulated diffraction signal within a preset criterion, determining the profile of the structure based on the optical metrology signal corresponding to the matching simulated diffraction signal; and
d) when the measured diffraction signal does not match the simulated diffraction signal within the preset criterion, varying one or more profile parameters of the optical metrology model or varying one or more parameters of the mathematic functions of the set of layers of the portion of the optical metrology model that corresponds to the region of the structure with the spatially varying property to generate another simulated diffraction signal and repeating steps b)-d).

13. A computer-readable storage medium containing computer executable instructions for causing a computer to model the profile of a structure having a region with a spatially varying property using an optical metrology model, wherein the optical metrology model is to be used to determine the profile of the structure using optical metrology when the structure is formed on a wafer, comprising instructions for:
defining a set of profile parameters for the optical metrology model to characterize the profile of the structure;
defining a set of layers for a portion the optical metrology model that corresponds to the substrate region of the structure with the spatially varying property, wherein the spatially varying property is a property of the substrate region, each layer having a defined height and width; and
for each layer, defining a mathematic function that varies across at least a portion of the width of the layer to characterize the spatially varying property within a corresponding layer in the substrate region of the structure, wherein the mathematical function characterizes the variation of the spatially varying property in a first direction and a second direction within the corresponding layer in the substrate region of the structure, and wherein the first and second directions are perpendicular.

14. A system to measure a structure having a region with a spatially varying property, the system comprising:
a source configured to direct an incident beam at the structure;
a detector configured to receive a diffracted beam from the structure, and to generate a measured diffraction signal based on the received diffraction beam; and
a processor configured to determine the profile of the structure by comparing the measured diffraction signal to one or more simulated diffraction signals, wherein the simulated diffraction signals are generated from an optical metrology model of the structure, wherein the optical metrology model is defined by a set of profile parameters to characterize the profile of the structure, wherein a set of layers is defined for a portion the optical metrology model that corresponds to the substrate region of the structure with the spatially varying property, wherein the spatially varying property is a property of the substrate region, each layer having a defined height and width, and for each layer, a mathematic function is defined that varies across at least a portion of the width of the layer to characterize the spatially varying property within a corresponding layer in the substrate region of the structure, wherein the mathematical function characterizes the variation of the spatially varying property in a first direction and a second direction within the corresponding layer in the substrate region of the structure, and wherein the first and second directions are perpendicular.

15. The system of claim 14, wherein the spatially varying property varies continuously in the first direction within the substrate region of the structure, wherein the mathematic function of a particular layer characterizes the variation of the spatially varying property in the first direction within the corresponding layer in the substrate region of the structure.

16. The system of claim 14, wherein the structure is a transistor with a gate region and active regions, wherein the substrate region of the structure with the spatially varying property corresponds to an active region of the transistor after the active region has been doped with a dopant, and wherein the spatially varying property is an index of refraction and coefficient of extinction.

17. The system of claim 14, wherein a simulated diffraction signal based on the optical metrology model of the structure using a numerical analysis technique.

18. The system of claim 17, wherein the numerical analysis technique is rigorous coupled-wave analysis.

19. The system of claim 17, wherein the simulated diffraction signal is generated using a machine learning system.

* * * * *